US009348951B2

(12) United States Patent
Xia et al.

(10) Patent No.: US 9,348,951 B2
(45) Date of Patent: May 24, 2016

(54) ROBUST DESIGN METHOD FOR A TEXTILE-MANUFACTURING-DEDICATED, HIGH-EFFICIENT, ENERGY-SAVING, MULTIPHASE ASYNCHRONOUS MOTOR

(71) Applicant: TIANJIN POLYTECHNIC UNIVERSITY, Tianjin (CN)

(72) Inventors: Changliang Xia, Tianjin (CN); Wei Chen, Tianjin (CN); Zhaowei Qiao, Tianjin (CN)

(73) Assignee: TIANJIN POLYTECHNIC UNIVERSITY, Tianjin (CN)

( * ) Notice: Subject to any disclaimer, the term of this patent is extended or adjusted under 35 U.S.C. 154(b) by 0 days.

(21) Appl. No.: 14/401,842

(22) PCT Filed: Oct. 31, 2012

(86) PCT No.: PCT/CN2012/083895
§ 371 (c)(1),
(2) Date: Nov. 18, 2014

(87) PCT Pub. No.: WO2013/177900
PCT Pub. Date: Dec. 5, 2013

(65) Prior Publication Data
US 2015/0127303 A1    May 7, 2015

(30) Foreign Application Priority Data
May 31, 2012 (CN) .......................... 2012 1 0176387

(51) Int. Cl.
G06F 17/50    (2006.01)

(52) U.S. Cl.
CPC . G06F 17/50 (2013.01); Y02T 10/82 (2013.01)

(58) Field of Classification Search
CPC .. G06F 17/5009; G06F 2217/78; H01L 24/03
USPC ....................................................... 703/4, 18
See application file for complete search history.

(56) References Cited

U.S. PATENT DOCUMENTS

2007/0078553 A1* 4/2007 Miwa ...................... G06F 17/50
700/97
2007/0107971 A1* 5/2007 Nagao et al. ................. 180/300

FOREIGN PATENT DOCUMENTS

| CN | 101264774 A | 9/2008 |
| CN | 101521438 A | 9/2009 |
| CN | 101833607 A | 9/2010 |

OTHER PUBLICATIONS

Energimyndigheten, NPL, "Improving the efficiency of squirrel cage induction", 2001.*

(Continued)

*Primary Examiner* — Omar Fernandez Rivas
*Assistant Examiner* — Herng-Der Day
(74) *Attorney, Agent, or Firm* — George G. Wang; Bei & Ocean

(57) ABSTRACT

Robust design method for a textile-manufacturing-dedicated multiphase asynchronous motor, including the steps: designing a motor with design variables for a high-efficient, energy-saving, multiphase asynchronous motor; selecting a number of controllable variables and their level values to build an inner orthogonal table; selecting a number of noise factors and their level values to build an outer orthogonal table; using a Taguchi method, determining the optimal combination of level values of the controllable variables and corresponding values ranges for a tolerance design, resulting in an optimal design scheme; producing technical drawings for each parts of the motor according to the optimal design scheme and producing a physical motor; comparing the performance of the physical motor with the predetermined performance target and repeating the above steps as many times as necessary until the performance target is met and the motor achieves the optimal balance between the quality and cost.

4 Claims, 1 Drawing Sheet

(56) References Cited

OTHER PUBLICATIONS

Y. Huang, NPL, "Dynamic parameter optimization of an automobile A/C compressor using taguchi method", 1998.*

Wang et al., "Application of Taguchi Method to Robust Design of BLDC Motor Performance", IEEE Transactions on Magnetics, vol. 35, No. 5, Sep. 1999, pp. 3700-3702.*

Pei Lei etc., Performance Improvement of Occupant Restraint System Based on Taguchi Robust Design Approach; <China Mechanical Enginering> May 2011, p. 1128-1133, vol. 22 No. 9, abst.

Chen, Peng-qi etc., Loss-minimization Control of Asynchronous Motor in Network Pressure-superposed Water Supply System <Micro-motor> 2010, p. 24-27, vol. 43 No. 6, abst.

Li Bin etc., Study on Water Supply System of Efficiency Optimization Control of Induction Motor <Electric Drive> 2010, p. 32-35, vol. 40 No. 3, abst.

Yan Yan etc., Speed Estimation of Doubly-fed induction generators based on active disturbance rejection control, <2010 International Conference on Electrical and Control Engineering>, p. 4223-4225.

* cited by examiner

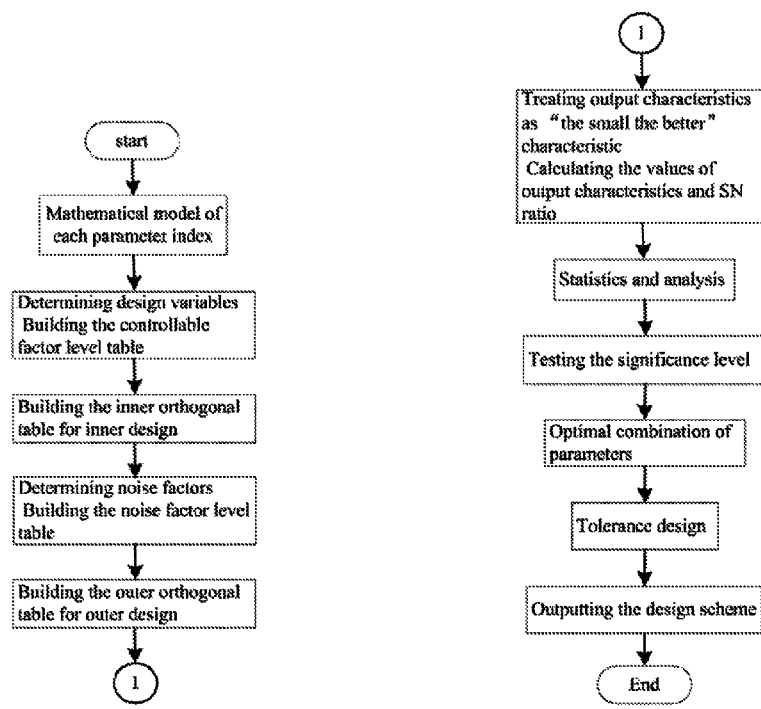

ROBUST DESIGN METHOD FOR A TEXTILE-MANUFACTURING-DEDICATED, HIGH-EFFICIENT, ENERGY-SAVING, MULTIPHASE ASYNCHRONOUS MOTOR

FIELD OF THE INVENTION

The present invention relates to a multiphase asynchronous motor. More particularly, it relates to a robust design method for a textile-manufacturing-dedicated, high-efficient, energy-saving, multiphase asynchronous motor.

BACKGROUND OF THE INVENTION

With the development of the motor system energy-saving engineering, the demand for high-efficient and energy-saving motor is gradually increased. Moreover, a motor that is specific to a certain industry and can be applied under different load characteristics is needed to be designed. Textile industry consumes large amounts of electric energy, so developing textile-manufacturing-dedicated and high-efficient motor is especially important. Nowadays, asynchronous motor has taken major share in the textile-manufacturing-dedicated motors, and it has quite matured design and production techniques. Therefore, for a lower startup cost, people are focus on researching and developing a textile-manufacturing-dedicated, high-efficient, energy-saving, multiphase asynchronous motor, which has wider application range, more profit and larger development in specific industries.

The design of the textile-manufacturing-dedicated motor is different from the design of the normal AC motor due to its special operation mode. On the one hand, considering the energy saving, the textile-manufacturing-dedicated motor requires higher operation efficiency and power factor to decrease the loss caused by reactive power transmission and reduce the investment of the reactive power equipment. On the other hand, although the textile-manufacturing-dedicated motors are designed according to the rated operating point, they are normally operating under unrated operating point in the actual operation due to the particularity of the work. Thus, the efficiency of the motor should be higher not only at the rated operating point but also in the wider operating range, so that the motor can be guaranteed to be high-efficient and energy-saving in the actual work.

The motor is a complicated coupling system whose various performances influence each other and constraint each other. To design a motor, various factors, such as operating efficiency, production cost, volume, should be comprehensively considered, as well as complicated constraints in the motor, such as electromagnetic load, overload capacity, torque characteristic, mechanical structure, ventilation and heat of the machine are still needed to be taken into account. Furthermore, the motor performance indexes is sensitive to the variation of the design parameter. Under the influence of the quality management such as business process control and production flow, the motor performances become declined at different levels and exist a certain number of discrete degree, thus it is difficult to guarantee the performance of large-scaled production of motor is consistent. Therefore, providing a robust design method for the motor that can meet the state standards, users requirements and specific constraints, which can make the comprehensive performance of the motor optimal, has vital influence on solving the conflicts among the motor performance indexes, and guaranteeing the high-efficient operation of the motor.

Traditional quality management method focuses on the later inspection after production, which wastes time and resources and lacks effective control for preventing non-conforming products. Moreover, the empirical process control lacks scientific design guide and is difficult to satisfy the demand for the products consistency of large-scaled production of motors. In 1970s, Taguchi method which is a robust design method and quality management technology is developed by Dr. Taguchi Genichi to pursue the optimal quality of products. Taguchi method employs reasonable experimental schemes to determine the optimal combinations of parameters. Then, the robustness of the products' quality characteristics against various disturbances is enhanced, and the optimal balance between the quality and cost is finally realized. Taguchi method divides the whole design process into three stages: system design, parameter design and tolerance design, so it is also called as three stages designs. And this method has achieved remarkable results in the research and production fields.

SUMMARY OF THE INVENTION

The present invention is intended to provide a robust design method for a textile-manufacturing-dedicated, high-efficient, energy-saving, multiphase asynchronous motor. The robust design method can increase the motor's rated operating efficiency, rated power factor, wider operating range and operating efficiency without a significant increase in cost.

The present invention includes a robust design method for a textile-manufacturing-dedicated, high-efficient, energy-saving, multiphase asynchronous motor, wherein, the design method includes the following steps:

(1) Designating a motor. especially an asynchronous motor as a robust design for the textile-dedicated machine;

(2) Designating Taguchi method as the robust design method for a textile-manufacturing-dedicated motor;

(3) Designating design variables for the high-efficient, energy-saving, multiphase asynchronous motor; taking all or partial variables of motor size, slot size, length of the air gap, conductors per slot and number of parallel branches as design variables for optimization; and selecting rated operating efficiency, rated power factor, smoothness of operating efficiency curve and production cost as the output characteristics; building mathematical models of each parameter respectively to constitute a robust design model with multiple indexes;

(4) Designating the level number and the corresponding values of the design variables for optimization, building the controllable factor level table; selecting an appropriate orthogonal table according to the number of the optimization variables and the level number of each variable, building an inner orthogonal table for inner design;

(5) Taking the effect of the motor's production and processing level, assembly technology, working condition and environment, internal structure degradation and operation wear into consideration, the parameter errors resulting from the above factors are taken as the noise factors; designating the level number of each noise factor and the corresponding value of each level; building the noise factor level table; selecting an appropriate orthogonal table according to the number of the noise factors and the level number of each factor, building an outer orthogonal table for outer design;

(6) Treating each output characteristic as "the small the better" characteristic respectively, the noise factor is listed in the outer orthogonal table corresponding to each combination of the inner orthogonal table, and computing the values of the output characteristic and signal to noise ratio of the experimental scheme determined by the inner and outer orthogonal tables;

(7) Carrying out variance analysis for the results, testing the significance levels of design parameters, the optimal combination of parameters is determined;

(8) Taking the optimal combination of parameters achieved from step (7) as the value of each parameter for optimization, further, determining fluctuation range of each parameter for tolerance design;

(9) Drawing the parts of the textile-manufacturing-dedicated, high-efficient, energy-saving, multiphase asynchronous motor according to the optimal design scheme, wire-cutting the mold, dieing, laminating, coiling, inserting winding, dipping paint and assembling, testing the actual operation indexes of the motor and comparing with the indexes given by the design scheme; if the indexes given by the design scheme exceed the required range of the operation indexes, then the performance design scheme is modified and the optimizing design is carried out again, otherwise, the design scheme is confirmed and batch manufacturing is carried out.

The motor of the present invention is a multiphase asynchronous motor which includes a stator and a rotor. The stator adopts multiphase, short-pitch and distributed winding structure, and the rotor adopts squirrel cage structure.

Building the mathematical model of each index respectively described in step (3) is:

$$f_1 = \eta_N = 1 - P^*_{LossN} \quad \text{(Formula 1)}$$
$$f_2 = \cos\varphi_N$$
$$f_3 = \sum_{i=2}^{n} c_i \frac{|\eta_i - \eta_{i-1}|}{\eta_i}$$
$$f_4 = W_1 C_{Mater.} + W_2 C_{Manuf.}$$

Where $f_1$ is the mathematical model of the rated operating efficiency of the high-efficient, energy-saving, multiphase asynchronous motor, which is a maximization problem;

$\eta_N$ is the rated operating efficiency of the high-efficient, energy-saving, multiphase asynchronous motor;

$P^*_{LossN}$ is the per-unit value of the total loss of the high-efficient, energy-saving, multiphase asynchronous motor, and the total loss includes the core loss, copper loss of the stator windings, copper (or aluminum) loss of the rotor windings, wind friction loss, stray loss;

$f_2$ is the mathematical model of the rated power factor of the high-efficient, energy-saving, multiphase asynchronous motor, which is a maximization problem;

$\phi_N$ is the rated power factor of the high-efficient, energy-saving, multiphase asynchronous motor;

$f_3$ is the mathematical model of the smoothness of operating efficiency curve of the high-efficient, energy-saving, multiphase asynchronous motor, which is a minimization problem;

$\eta_i$ and $c_i$ represent the operating efficiency and the corresponding weight of the high-efficient, energy-saving, multiphase asynchronous motor at different rotation speeds respectively;

$f_4$ is the mathematical model of the production cost of the high-efficient, energy-saving, multiphase asynchronous motor, which is a minimization problem;

$W_1$ and $W_2$ represent the weighting coefficients of the effective material cost and the fabricating cost of the high-efficient, energy-saving, multiphase asynchronous motor respectively, and different cost strategies can be determined according to the specialized knowledge and practical experience;

$C_{Mater.}$ and $C_{Manuf.}$ represent the effective material cost and the fabricating cost of the high-efficient, energy-saving, multiphase asynchronous motor respectively; the effective material cost is consist of the cost of iron, copper (or aluminum), insulating materials, etc; the fabricating cost is the other cost except the effective material cost during the motor production; the proportional relation between effective material dosage and fabricating cost can be adjusted according to the actual situation.

The parameter designing process described from step (4) to step (7) can be carried out several rounds, and each new parameter designing process will build a new controllable factor level table and an inner orthogonal table according to the last round of designing and analyzing results of parameters.

The method for analyzing the designing results of multiple indexes adopted by step (6) and step (7) is one of the following two methods:

Method I: First, rated operating efficiency, rated power factor, smoothness of operating efficiency curve and production cost of the textile-manufacturing-dedicated, high-efficient, energy-saving, multiphase asynchronous motor are regarded as the singular performance index respectively to be designed and analyzed independently. In the analysis process, when the design and analysis is carried out around one of the indexes, other indexes are regarded as constraint conditions, and the design results are compared comprehensively finally. Based on the Game Theory, the optimal design scheme is achieved;

Method II: According to the actual situation, the motor's rated operating efficiency, rated power factor, smoothness of operating efficiency curve and production cost of the textile-manufacturing-dedicated, high-efficient, energy-saving, multiphase asynchronous motor are converted into singular performance indexes to determine the optimal design scheme relying on the specialized knowledge or on-site experience.

Considering the actual operating characteristics of the textile-manufacturing-dedicated motor, the robust design method for a textile-manufacturing-dedicated, high-efficient, energy-saving, multiphase asynchronous motor in the present invention goes through system design, parameter design and tolerance design to achieve a stable performance, reliable operation, low production cost, high-efficient, energy-saving, multiphase asynchronous motor. The motor obtained by the invention achieves the optimal balance between the quality and the cost, improves market competitiveness of the production, and has the following characteristics:

1. Based on the asynchronous motor, researching and developing textile-manufacturing-dedicated, high-efficient, energy-saving, multiphase asynchronous motor can make use of the matured experiences and specialized technologies of designing and producing the common asynchronous motor, which can make the initial cost lower. The design scheme takes actual operating characteristics of the textile-manufacturing-dedicated motor into full consideration, thus the motor can meet the performance requirement of the textile industries and meet the national standards. Using multiphase asynchronous motor as the textile-manufacturing-dedicated motor has some advantages, on the one hand, the demand for the low-voltage high-power motor can be satisfied, on the other hand, the harmonic contents of the motor can be reduced effectively, further the torque ripple, electromagnetic vibration and total loss can be decreased, as well as the operating efficiency and reliability of the motor can be increased, what's more, the motor has a higher material utilization.

2. The present invention selects rated operating efficiency and rated power factor as the optimization goal, which makes the motor operate efficiently and save energy, while decreases losses caused by reactive transmission and putting in the reactive compensator; the invention also selects the smoothness of operating efficiency curve as the optimization goal, which guarantees the motor has a higher efficiency within a wider range of operation, thus the effects of high-efficient and energy-saving can be reached in the actual operation; at the same time, the invention selects production cost as the optimization goal, which maximizes the economic benefits of the motor without significantly increasing the investment of total costs including the effective material cost and fabricating cost on the premise of achieving the demand for the high efficiency and energy saving index.

3. Taguchi method is served as the robust design method to design, develop, research and produce high-efficient, energy-saving, multiphase asynchronous motor. The present invention comprehensively considers that the motor performance indexes are sensitive to the variation of the design parameters, and the quality management of the motor manufacturing enterprise such as procedure control and production process. Combining the design and development of production with the quality management, influences of the various disturbances on the motor performance indexes are weakened, and the robustness of high-efficient operation is increased, meanwhile the market competitiveness of the high-efficient, energy-saving, multiphase asynchronous motor is enhanced in the field of textile industry.

BRIEF DESCRIPTION OF THE DRAWINGS

FIG. 1 shows flow chart of the robust design method for a textile-manufacturing-dedicated, high-efficient, energy-saving, multiphase asynchronous motor proposed by the present invention.

DETAILED DESCRIPTION OF THE INVENTION

Combining the embodiment with the accompanied drawing, the detailed description for the robust design method of the high-efficient, energy-saving, multiphase asynchronous motor are illustrated as follows.

The textile industry consumes large amount of electrical energy, and the specific motor for textile industry suffers from the problems of long working time and high energy consumption and the like. With the in-depth implementation of the national energy conservation and emissions reduction policy, the deeper and higher requirements for motor system are proposed. Meanwhile, to obtain better load matching characteristic and break the current situation that the same type motor is applied for the different applications, the new indexes are proposed for the design and development of the specific motor for a certain industry. Therefore, developing textile-manufacturing-dedicated, high-efficient, energy-saving motor has significant economic benefits and social benefits, and is significant for promoting the development of the textile industry.

The textile-manufacturing-dedicated, high-efficient, energy-saving motor requires high operating efficiency and high power factor to achieve the effects of energy saving. Meanwhile, the textile-manufacturing-dedicated motors normally operate under unrated point, thus, the motor requires higher efficiency not only at the rated operating point, but also in the wider range of operation to realize high-efficiency and energy-saving in the actual operation. Considering comprehensively the operating characteristics of the textile-manufacturing-dedicated motor, the present invention regards the motor's rated operating efficiency, rated power factor, smoothness of operating efficiency curve and production cost as the design indexes to realize the motor operates under high efficiency and good quality state and promote the research of high-efficient and energy-saving technology and the development of the series of products on the basis of the inapparent increase of the initial cost.

Reliability and stability is known as the precondition of high efficiency operation of the motor. Because the motor performance indexes are sensitive to the variation of the design parameters, performances of motor will be deteriorated at different levels due to the variation of parameters caused by manufacturing process, processing equipment, operating environment, operating period and the like, thus it is difficult to satisfy the demand of large-scaled production of motors for consistency of the products. The present invention uses Taguchi method to design high-efficient, energy-saving multiphase asynchronous motor, thus the robust scheme is provided for realizing the performance indexes of the motor.

As shown in FIG. 1, in the present invention, the robust design method for a textile-manufacturing-dedicated, high-efficient, energy-saving, multiphase asynchronous motor includes the following steps:

(1) Designating a motor, especially an asynchronous motor as a robust design for the textile-dedicated machine;

(2) Designating Taguchi method as the robust design method for a textile-manufacturing-dedicated motor;

(3) Designating design variables for the high-efficient, energy-saving, multiphase asynchronous motor; taking all or partial variables of motor size, slot size, length of the air gap, conductors per slot and number of parallel branches design variables for optimization; and selecting rated operating efficiency, rated power factor, smoothness of operating efficiency curve and production cost as the output characteristics; building mathematical models of each parameter respectively to constitute a robust design model with multiple indexes;

Wherein, building the mathematical model of each index respectively is as follows:

$$f_1 = \eta_N = 1 - P_{LossN}^*$$ (Formula 1)

$$f_2 = \cos\varphi_N$$

$$f_3 = \sum_{i=2}^{n} c_i \frac{|\eta_i - \eta_{i-1}|}{\eta_i}$$

$$f_4 = W_1 C_{Mater.} + W_2 C_{Manuf.}$$

Where $f_1$ is the mathematical model of the rated operating efficiency of the high-efficient, energy-saving, multiphase asynchronous motor, which is a maximization problem;

$\eta_N$ is the rated operating efficiency of the high-efficient, energy-saving, multiphase asynchronous motor;

$P_{LossN}^*$ is the per-unit value of the total loss of the high-efficient, energy-saving, multiphase asynchronous motor, and the total loss includes iron loss, copper loss of stator windings, copper (or aluminum) loss of rotor windings, friction loss and stray loss;

$f_2$ is the mathematical model of the rated power factor of the high-efficient, energy-saving, multiphase asynchronous motor, which is a maximization problem;

$\phi_N$ is the rated power factor of the high-efficient, energy-saving, multiphase asynchronous motor;

$f_3$ is the mathematical model of the smoothness of operating efficiency curve of the high-efficient, energy-saving, multiphase asynchronous motor, which is a minimization problem;

$\eta_i$ and $c_i$ represent the operating efficiency and the corresponding weight of the high-efficient, energy-saving, multiphase asynchronous motor at different rotation speed respectively;

$f_4$ is the mathematical model of the production cost of the high-efficient, energy-saving, multiphase asynchronous motor, which is a minimization problem;

$W_1$ and $W_2$ represent the weighting coefficients of the effective material cost and the fabricating cost of the high-efficient, energy-saving, multiphase asynchronous motor respectively, and different cost strategies can be determined according to the specialized knowledge and practical experience;

$C_{Mater.}$ and $C_{Manuf.}$ represent the effective material cost and the fabricating cost of the high-efficient, energy-saving, multiphase asynchronous motor respectively; the effective material cost consist of the cost of iron, copper (or aluminum) and insulating materials, etc; the fabricating cost is the other cost except the effective material cost during the motor production; the proportional relation between effective material dosage and fabricating cost can be adjusted according to the actual situation.

(4) Designating the level number and the corresponding values of the design variables for optimization, Building the controllable factor level table; selecting an appropriate orthogonal table according to the number of the optimization variables and the level number of each variable, building an inner orthogonal table for inner design;

(5) Taking the effect of the motor's production and processing level, assembly technology, working condition and environment, internal structure degradation and operation wear into consideration, the parameter errors resulting from the above factors are taken as the noise factors; designating the level number of each noise factor and the corresponding value of each level, building the noise factor level table; selecting an appropriate orthogonal table according to the number of the noise factors and the level number of each factor, building an outer orthogonal table for outer design;

(6) Treating each output characteristic as "the small the better" characteristic respectively. The noise factor is listed in the outer orthogonal table corresponding to each combination of the inner orthogonal table. The values of the output characteristic and signal to noise ratio of the experimental scheme determined by the inner and outer orthogonal tables are computed;

Supposing that $Z_1, Z_2, \ldots, Z_n$ are values of n output characteristics, according to the statistical theory, the unbiased estimates of $\mu$, $\sigma^2$ and $\mu^2$ are:

$$\hat{\mu} = \frac{1}{n}\sum_{i=1}^{n} z_i \quad \text{(Formula 2)}$$

$$\hat{\sigma}^2 = \frac{1}{n-1}\sum_{i=1}^{n}(z_i - \hat{\mu})^2 \quad \text{(Formula 3)}$$

$$\hat{\mu}^2 = \frac{1}{n}\left[\left(\sum_{i=1}^{n} z_i\right)^2 - \hat{\sigma}^2\right] \quad \text{(Formula 4)}$$

For singular characteristic index, the SNR value of "the small the better" characteristic is:

$$SN = 1/(\mu^2 + \sigma^2) \quad \text{(Formula 5)}$$

Furthermore, representing SN as ten times the logarithmic form is:

$$SN = -10\log\left(\frac{1}{n}\sum_{i=1}^{n} z_i^2\right) \quad \text{(Formula 6)}$$

(7) Carrying out variance analysis for the results, testing the significance levels of design parameters to determine the optimal combination of parameters;

(8) Taking the optimal combination of parameters achieved from step (7) as the value of each parameter for optimization. Further, fluctuation range of each parameter is determined for tolerance design;

(9) Drawing the parts of the textile-manufacturing-dedicated, high-efficient, energy-saving, multiphase asynchronous motor according to the optimal design scheme, wire-cutting the mold, dieing, laminating, coiling, inserting winding, dipping paint and assembling, testing the actual operation indexes of the motor and comparing with the indexes given by the design scheme. If the indexes given by the design scheme exceed the required range of the operation indexes, then the performance design scheme is modified and the optimizing design is carried out again, otherwise, the design scheme is confirmed and batch manufacturing is carried out.

The parameter designing process described from step (4) to step (7) can be carried out several rounds, and each new parameter designing process will build a new controllable factor level table and an inner orthogonal table according to the last round of designing and analyzing results of parameters.

The method for analyzing the design results of multiple indexes adopted by step (6) and step (7) is one of the following two methods:

Method I: First, rated operating efficiency, rated power factor, smoothness of operating efficiency curve and production cost of the textile-manufacturing-dedicated, high-efficient, energy-saving, multiphase asynchronous motor are regarded as the singular performance index respectively to be designed and analyzed independently. In the analysis process, when the design and analysis is carried out around one of the indexes, other indexes are regarded as constraint conditions, and the design results are compared comprehensively finally. Based on the Game Theory, the optimal design scheme is achieved;

Method II: According to the actual situation, the rated operating efficiency, rated power factor, smoothness of operating efficiency curve and production cost of the textile-manufacturing-dedicated, high-efficient, energy-saving, multiphase asynchronous motor are converted into singular performance indexes to determine the optimal design scheme relying on the specialized knowledge or on-site experience.

After designating the motor, designating Taguchi method and building the mathematical model of each index described in Formula 1, the embodiment of the present invention determines the variables for optimization according to the characteristics of the object. In view of the above, the controllable factor level table is built, and the inner orthogonal table is built for inner design according to the design principles of orthogonal table.

The variables for optimization of the embodiment include: inner diameter of the stator core of asynchronous motor $D_i$, length of core $L_i$, ratio between slot width and tooth width of stator $K_{bt1}$, ratio between slot width and tooth width of rotor $K_{bt2}$, ratio between slot height and yoke height of stator $K_{hj1}$, ratio between slot height and yoke height of rotor $K_{hj2}$, conductor number per slot of stator $N_{s1}$, and conductor number per slot of rotor $N_{s2}$.

Each variable for optimization takes 7 levels, each level is represented by identification plus level number, and the value of each level is called as nominal value of corresponding variable, as shown in Table 1.

TABLE 1

Table of Factor Degrees

| | | Degree | | | | | | |
|---|---|---|---|---|---|---|---|---|
| Tag | Factor | 1 | 2 | 3 | 4 | 5 | 6 | 7 |
| A | $D_i$ | A1 | A2 | A3 | A4 | A5 | A6 | A7 |
| B | $L_i$ | B1 | B2 | B3 | B4 | B5 | B6 | B7 |
| C | $K_{bt1}$ | C1 | C2 | C3 | C4 | C5 | C6 | C7 |
| D | $K_{bt2}$ | D1 | D2 | D3 | D4 | D5 | D6 | D7 |
| E | $K_{hj1}$ | E1 | E2 | E3 | E4 | E5 | E6 | E7 |
| F | $K_{hj2}$ | F1 | F2 | F3 | F4 | F5 | F6 | F7 |
| G | $N_{s1}$ | G1 | G2 | G3 | G4 | G5 | G6 | G7 |
| H | $N_{s2}$ | H1 | H2 | H3 | H4 | H5 | H6 | H7 |

Because the embodiment selects 8 factors and each factor selects 7 levels, the eight factors & seven levels orthogonal table is selected as the inner orthogonal table, and the 8 factors can be arranged randomly when designing the orthogonal table header.

In view of the impact of various disturbances on the motor quality characteristics, the errors of the design parameters caused by production and processing art, assembly technologies, working conditions and environment, internal structure degradation and operating wear is selected as the noise factor. Accordingly, the noise factor level table is built. Meanwhile, an outer orthogonal table is built for outer design according to the design principles of orthogonal table.

In the embodiment, manufacturing error of the following variables including: inner diameter of the stator core, length of core, width of stator slot $b_{11}$, width of rotor slot $b_{12}$, height of stator slot $h_{21}$, height of rotor slot $h_{22}$, length of air gap $\delta$, width of stator slot opening $b_{01}$, height of stator slot opening $h_{01}$, width of rotor slot opening $b_{02}$, height of rotor slot opening $h_{02}$ are considered, and the actual processing tolerance is taken as the value of the above errors, as shown in Table 2. The nominal values of the last five error factors are identified values of the design scheme.

TABLE 2

Table of Noise Factors

| | | Degree | | |
|---|---|---|---|---|
| Tag | Factor | 1 | 2 | 3 |
| A' | $D_i$ | Nominal Value-tolerance/2 | Nominal Value-tolerance/2 | Nominal Value-tolerance/2 |
| B' | $L_i$ | Nominal Value-tolerance/2 | Nominal Value-tolerance/2 | Nominal Value-tolerance/2 |
| C' | $b_{11}$ | Nominal Value-tolerance/2 | Nominal Value-tolerance/2 | Nominal Value-tolerance/2 |
| D' | $b_{12}$ | Nominal Value-tolerance/2 | Nominal Value-tolerance/2 | Nominal Value-tolerance/2 |
| E' | $h_{21}$ | Nominal Value-tolerance/2 | Nominal Value-tolerance/2 | Nominal Value-tolerance/2 |

TABLE 2-continued

Table of Noise Factors

| | | Degree | | |
|---|---|---|---|---|
| Tag | Factor | 1 | 2 | 3 |
| F' | $h_{22}$ | Nominal Value-tolerance/2 | Nominal Value-tolerance/2 | Nominal Value-tolerance/2 |
| I' | $\delta$ | Nominal Value-tolerance/2 | Nominal Value-tolerance/2 | Nominal Value-tolerance/2 |
| J' | $b_{01}$ | Nominal Value-tolerance/2 | Nominal Value-tolerance/2 | Nominal Value-tolerance/2 |
| K' | $h_{01}$ | Nominal Value-tolerance/2 | Nominal Value-tolerance/2 | Nominal Value-tolerance/2 |
| L' | $b_{02}$ | Nominal Value-tolerance/2 | Nominal Value-tolerance/2 | Nominal Value-tolerance/2 |
| M' | $h_{02}$ | Nominal Value-tolerance/2 | Nominal Value-tolerance/2 | Nominal Value-tolerance/2 |

Because the embodiment in the present invention selects 11 error factors, and each factor selects 3 levels, the 13 factors & 3 levels orthogonal table is suitable for the outer orthogonal table, and the 11 factors can be arranged randomly when designing the table header.

Among the four performance optimization indexes of the motor, the smoothness of operating efficiency curve function and the production cost function are non-negative minimization problems; although the values of the rated operating efficiency function and rated power factor function are expected to be the bigger the better, the values are less than 1. Based on the above, the non-negative minimization problems can be achieved by subtracting the function value from 1 respectively. Thus, all the four performance optimization indexes can be analyzed by "the small the better" characteristic, and it can be taken as the robust index to evaluate the production quality characteristics. The object of "the small the better" characteristic expects that the output characteristics are the smaller the better, and the ideal value is 0 and non-negative. The product whose quality characteristic z obeys the normal distribution $N(\mu, \sigma^2)$ is equivalent to expect that the expectation value $\mu$ of the output characteristics are the smaller the better, and the variance $\sigma^2$ is also the smaller the better. To unify dimension, $\mu^2+\sigma^2$ can be required to be the smaller the better.

Corresponding to each combination of the inner orthogonal table, the error factors are listed in the outer orthogonal table. The embodiment in the present invention selects 7 factors & 8 levels orthogonal table for the inner orthogonal table, and it arranges 49 experimental schemes; as well as it selects 13 factors & 3 levels orthogonal table for the outer orthogonal table, and arranges 27 experimental schemes. According to the principle that each combination of the inner orthogonal table is corresponding to an outer orthogonal table, totally 27×49=1323 experiments are carried out. The values of output characteristics of the 27 experiments which is arranged by each combination of the inner orthogonal table according to the outer orthogonal table are calculated by formula 1; SNR value is also calculated by formula 2 to formula 6; then variance analysis is carried out for the experimental results to research the impact of change of the experimental condition on the quality characteristics. For one thing, it can evaluate the significance level of the impact of the experimental factor on the quality characteristics; besides, it helps to determine the optimal combination of the experiment factors, that is to determine which state of the experiment factors can make the quality characteristics optimal.

The larger the SNR value is, the smaller the fluctuations of quality characteristics and the better the resistance to interference will be, in addition, the quality becomes more stable, and the qualified rate is higher. When multiple indexes exist simultaneously, one of the following methods can be adopted:

Method I: First, rated operating efficiency, rated power factor, smoothness of operating efficiency curve and production cost of the textile-manufacturing-dedicated, high-efficient, energy-saving, multiphase asynchronous motor are regarded as the singular performance index respectively to be designed and analyzed independently. In the analysis process, when the design and analysis is carried out around one of the indexes, other indexes are regarded as constraint conditions, and the design results are compared comprehensively finally. Based on the Game Theory, the optimal design scheme is achieved;

Method II: According to the actual situation, the rated operating efficiency, rated power factor, smoothness of operating efficiency curve and production cost of the textile-manufacturing-dedicated, high-efficient, energy-saving, multiphase asynchronous motor are converted into singular performance indexes to determine the optimal design scheme relying on the specialized knowledge or on-site experience.

After finishing a round of parameter design, if the design scheme is not satisfied, a new round of parameter design is conducted. According to the last round of results of parameter design, based on the significant relations among the experimental factors and level relations among the levels, the trend of the impact of the experiment factors on the quality characteristics is estimated, and the controllable factor level table is rebuilt. Meanwhile, an inner orthogonal table is constructed for inner design according to the design principles of orthogonal table. The above steps can be repeated for a number of times until achieving the satisfied design scheme.

The optimal parameter of the quality characteristics is determined by parameter design, and the grade of components and processing precision are normally lower at present, meanwhile the fluctuation range of the parameters are normally large. To decrease the fluctuation of the quality characteristic, the grade and precision of the major factors can be increased considering the economical efficiency and the premise that total social loss is not increased. That is, the tolerance design is done, and the optimal balance between the quality and the cost is quested by establishing the loss function.

The steps of tolerance design of the embodiments are as follows:

1̂ the optimal parameters determined by parameter design are taken as the nominal value;

2̂ Adopting the error factors and the corresponding fluctuation range determined by the parameter design, the noise factor table corresponding to the optimal parameters is designed, as well as 13 factors & 3 levels orthogonal table is selected to match the 11 error factors;

3̂ The values of the output characteristic and SNR of the experimental scheme that is determined by the orthogonal table are computed by formula 1 to formula 6;

4̂ The variance analysis is carried out for the results data and the significance degrees of the design parameters are determined;

5̂ tolerance design. The pros and cons of the tolerance design is evaluated by loss function L (formula 7). The tolerance range of the design parameters which have a significant influence the output characteristics is narrowed. The value of loss function is computed by formula 7, and it is compared with the value of loss function of the design scheme before narrowing the tolerance range, meanwhile, the increase of the cost caused by the compression of the tolerance range is also considered. If the reduced cost caused by the average quality loss is higher than the increased cost, narrowing the tolerance range is feasible, otherwise, it is not feasible.

The loss function L is:

$$L = k\left[\frac{1}{n}\sum_{i=1}^{n}(z_i - m)^2\right]$$ (Formula 7)

Where k is the coefficient of loss function; m is the object value of output characteristic;

Considering the actual operating characteristics of textile-manufacturing-dedicated motor, the present invention achieves a high-efficient, energy-saving, multiphase asynchronous motor with stable performance, reliable operation and low cost finally, which goes through system design, parameter design and tolerance design. The motor achieves the optimal balance between the quality and cost, and enhances the market competence.

A detailed illustration is carried out around the embodiment of the invention. The preferred method or the specific expressions of some characteristics should be understood as this specification describes the invention by means of giving an embodiment. While some details in the composition, structure, and usage including the combination of some parts may be changed, and these transformations and applications should all belong to the range of the invention.

What is claimed is:

1. A method for designing a motor dedicated to textile manufacturing, comprising the following steps:
   (1) designing a motor comprising a stator and a rotor; said stator having a core defined by a diameter and a length, a slot defined by a width and a height, a tooth defined by a width, a yoke defined by a height, and a number of conductors; said rotor having a slot defined by a width and a height, a tooth defined by a width, a yoke defined by a height, and a number of conductors;
   (2) selecting controllable variables for optimization of said designed motor; said controllable variables comprising $D_i$ as diameter of said core of said stator, $L_i$ as length of said core of said stator, $K_{bt1}$ as ratio between the width of said slot of said stator and the width of said tooth of said stator, $K_{bt2}$ as ratio between the width of said slot of said rotor and the width of said tooth of said rotor, $K_{hj1}$ as ratio between the height of said slot of said stator and the height of said yoke of said stator, $K_{hj2}$ as ratio between the height of said slot of said rotor and the height of said yoke of said rotor, $N_{s1}$ as number of conductors of each said slot of said stator; and $N_{s2}$ as number of conductors of each said slot of said rotor;
   (3) selecting output indexes, which comprise a rated operating efficiency, a rated power factor, a degree of smoothness of operating efficiency curve, and a production cost;
   (4) for each controllable variable selected in step (2), selecting a plurality of levels and for each level determining a corresponding value, and further building an orthogonal table based on the controllable variables and their level values, referred to as inner orthogonal table for controllable variables;
   (5) selecting a number of noise factors related to assembly technologies, working conditions and environment, internal structure degradation and operation wear; selecting a plurality of levels and for each level determining a corresponding value for each selected noise factor, and further building another orthogonal table based on the noise factors and their level values, referred to as outer orthogonal table for noise factors; the outer orthogonal table, together with the inner orthogonal table, defining a plurality of experimental schemes;

(6) computing a value of each output index selected in step (3) and a corresponding signal-to-noise ratio for each experimental scheme defined by the inner orthogonal table and the outer orthogonal table;

(7) carrying out variance analyses, based on a Taguchi method, for the results obtained from step (6) to obtain a significance level of each controllable variable of step (2) on each output index of step (3) and thereby determine an optimal combination of level values of the controllable variables;

(8) based on the results of the variance analyses obtained in step (7), determining a value range for each optimal level value of each controllable variable of step (2) as part of a tolerance design;

(9) producing technical drawings for each part of said motor according to the optimal combination of level values of the controllable variables obtained in step (7) as well as tolerance value ranges determined in step (8), referred to as a design scheme and building a physical motor by wire-cutting a mold, dieing, laminating, coiling, inserting windings, dipping paint and assembling parts so that the physical motor is constructed with the controllable variables $D_i$, $L_i$, $K_{bt1}$, $K_{bt2}$, $K_{hj1}$, $K_{hj2}$, $N_{s1}$ and $N_{s2}$ as specified by the values determined according to the design scheme; and

(10) testing and obtaining actual output indexes of the physical motor built in step (9) and comparing each actual output index with a corresponding predetermined rated value range for each output index; if an actual output index is outside the corresponding predetermined rated value range, the inner orthogonal table built in step (4) is modified with a different level value for one or more controllable variables and step (5) to step (10) are repeated, or otherwise, said design scheme is confirmed and batch manufacturing is carried out.

2. The method according to claim 1, wherein said motor is a multiphase asynchronous motor, said stator adopts multiphase, short-pitch, and distributed winding structure and said rotor adopts a squirrel cage structure.

3. The method according to claim 1, wherein step (5) to step (10) are repeated several rounds, each with a new inner orthogonal table, which are based on corresponding tables of last round and actual output indexes of last round testing.

4. The method according to claim 1, wherein the experimental schemes defined in step (5) is by: (I) a method where each of the rated operating efficiency, the rated power factor, the smoothness of operating efficiency curve, and the production cost of the motor is regarded as a singular performance index to be designed and analyzed independently; when one of the indexes is analyzed, other indexes are regarded as constraint, and the design results are finally compared comprehensively to obtain an optimal set of the experimental schemes based on the Game Theory or (II) a method where the rated operating efficiency, the rated power factor, the smoothness of operating efficiency curve, and the production cost of the motor are converted into a singular performance index to determine an optimal set of the experimental schemes.

* * * * *